United States Patent [15] 3,680,002
Quine [45] July 25, 1972

[54] MICROSTRIP MICROWAVE OSCILLATORS

[72] Inventor: John P. Quine, Schenectady, N.Y.
[73] Assignee: General Electric Company

[22] Filed: Oct. 19, 1970
[21] Appl. No.: 81,767

[52] U.S. Cl. ....................331/96, 331/99, 331/107 R, 331/107 G, 333/84 M
[51] Int. Cl. ....................H03b 7/14
[58] Field of Search ..........331/96, 99, 107 R, 107 G, 117 D; 333/84 M

[56] References Cited

UNITED STATES PATENTS 3,336,535 8/1967 Mosher ....................331/99 X
3,534,267 10/1970 Hyltin ....................331/107 G X

*Primary Examiner*—Roy Lake
*Assistant Examiner*—Siegfried H. Grimm
*Attorney*—John F. Ahern, Paul A. Frank, Julius J. Zaskalicky, Donald R. Campbell, Frank L. Neuhauser, Oscar B. Waddell and Joseph B. Forman

[57] ABSTRACT

A microwave oscillator in microstrip form is single-tuned simultaneously at both fundamental and second harmonic frequencies to enhance efficient generation of fundamental frequency output voltage. The circuit, manufacturable by printed circuit techniques, comprises a microstrip cavity formed by a strip resonator and solid state oscillator device. The orthogonally arranged output circuit is capacitively coupled for fundamental frequency impedance matching and includes a coupling line terminated by an open-ended-line filter network which passes fundamental frequency energy while reflecting second harmonic energy. An application is LSA-mode operation of transferred-electron diodes.

14 Claims, 7 Drawing Figures

Inventor
John P. Quine
by Ronald R. Campbell
His Attorney

Inventor
John P. Quine
by Ronald R. Campbell
His Attorney

Inventor
John P. Quine
by Ronald R. Campbell
His Attorney

Inventor
John P. Quine
by Ronald R. Campbell
His Attorney

MICROSTRIP MICROWAVE OSCILLATORS

BACKGROUND OF THE INVENTION

This invention relates to microwave oscillators in microstrip form employing solid-state oscillator devices. More particularly, the invention relates to microstrip oscillators single-tuned at both fundamental and second harmonic frequencies suitable, for example, for operating transferred-electron diodes with high efficiency in the limited space-charge-accumulation (LSA) mode.

There is need for microwave oscillators in microstrip form in order to realize the advantages of small size, low weight, and low cost fabrication by printed circuit techniques. Microstrip oscillators are appropriate to the use of solid-state oscillator devices such as the transferred electron diode and the avalanche diode, and are compatible with microwave microelectronic integrated circuit employing alumina substrates. Typical applications for these oscillators are as phase-locked microwave sources for active element phased-array antennas, and as power sources in solid-state power combiners.

Transferred-electron diodes operated in the LSA mode are presently a high power source of solid-state microwave power as compared to other operating modes and other types of solid-state oscillator diodes. The frequency of LSA-mode oscillation is considerably higher than the transit-time frequency obtained when a transferred electron diode is operated in the high-field domain mode and requires, in addition to the dc bias, an external resonant circuit tuned to a higher frequency. To explain this further, the application of a dc voltage exceeding the threshold to a conventional transferred-electron diode with an above-critical doping-length product produces coherent microwave oscillations having a period proportional to the time for a moving dipole domain to traverse the length of the device. These are known as Gunn oscillations and result from the inherent properties of the bulk semiconductor, usually gallium arsenide. In the LSA mode of operation, the total electric field across the diode caused by the bias source and superimposed rf voltage rises above the threshold field so quickly that the space-charge distribution associated with a high-field domain does not have time to form. The injected electron accumulation layer is quenched in the interelectrode spaced upon the downswing of the rf voltage to a point where the total field is below the quenching field. The microwave power generated as well as the frequency of the oscillations are higher than in the high-field domain mode.

It has been shown that the dc to rf conversion efficiency is increased when the external rf voltage has both fundamental and second harmonic components. This is an easily obtained approximation of the ideal applied voltage, a half sinusoid. The present microstrip oscillators embody single-tuned microstrip cavities for simultaneously applying fundamental and second harmonic rf voltages to an LSA-mode diode. However, the invention is applicable generally to microstrip oscillators employing solid-state microwave oscillator devices that require other than fundamental voltage tuning.

SUMMARY OF THE INVENTION

A microwave oscillator in microstrip form is tuned simultaneously at both the fundamental and second harmonic frequencies to obtain increased efficiency of generation of fundamental frequency output voltage in a circuit employing a sOlid state oscillator device such as a transferred-electron diode or avalanche diode. In the oscillator circuit, a microstrip cavity is formed by a strip resonator and the solid state oscillator device connected between the strip resonator and a ground plane, with means for applying a bias voltage to the device. An orthogonally extending microstrip output circuit includes a coupling line that is series capacitor coupled to the strip resonator in alignment with the oscillator device and is terminated by a low pass filter network which passes fundamental frequency energy while reflecting second harmonic energy. By tuning the oscillator at both the fundamental and second harmonic frequency, there is applied to the oscillator device, in addition to the bias voltage, a total rf voltage waveform that is the sum of the fundamental and second harmonic voltages.

In one embodiment, the low pass filter network provides an effective short circuit or minimum impedance plane near the end of the coupling line, and second harmonic tuning is obtained by tuning the inductance of the coupling line with the circuit capacitance. Fundamental frequency tuning is obtained by tuning the inductance of the strip resonator with the circuit capacitance. In other embodiments, the low pass filter network provides an open circuit near the end of the coupling line, which is one-quarter wavelength in length measured at the second harmonic frequency. The oscillator device is mounted intermediate the ends of the strip resonator in a two-frequency tuned cavity at distances to tune at both the fundamental and second harmonic frequencies. In either embodiment, a shorted-line resonator or a shorted-line, open-ended resonator can be used, and in both embodiments fundamental frequency impedance matching is accomplished by means of the series coupling capacitor. The circuits are suitable for fabrication on an alumina substrate by printed circuit techniques. They are advantageously used for relaxation LSA-mode and normal LSA-mode operation of transferred-electron diodes.

DESCRIPTION OF THE PREFERRED EMBODIMENTS

Figure 1:
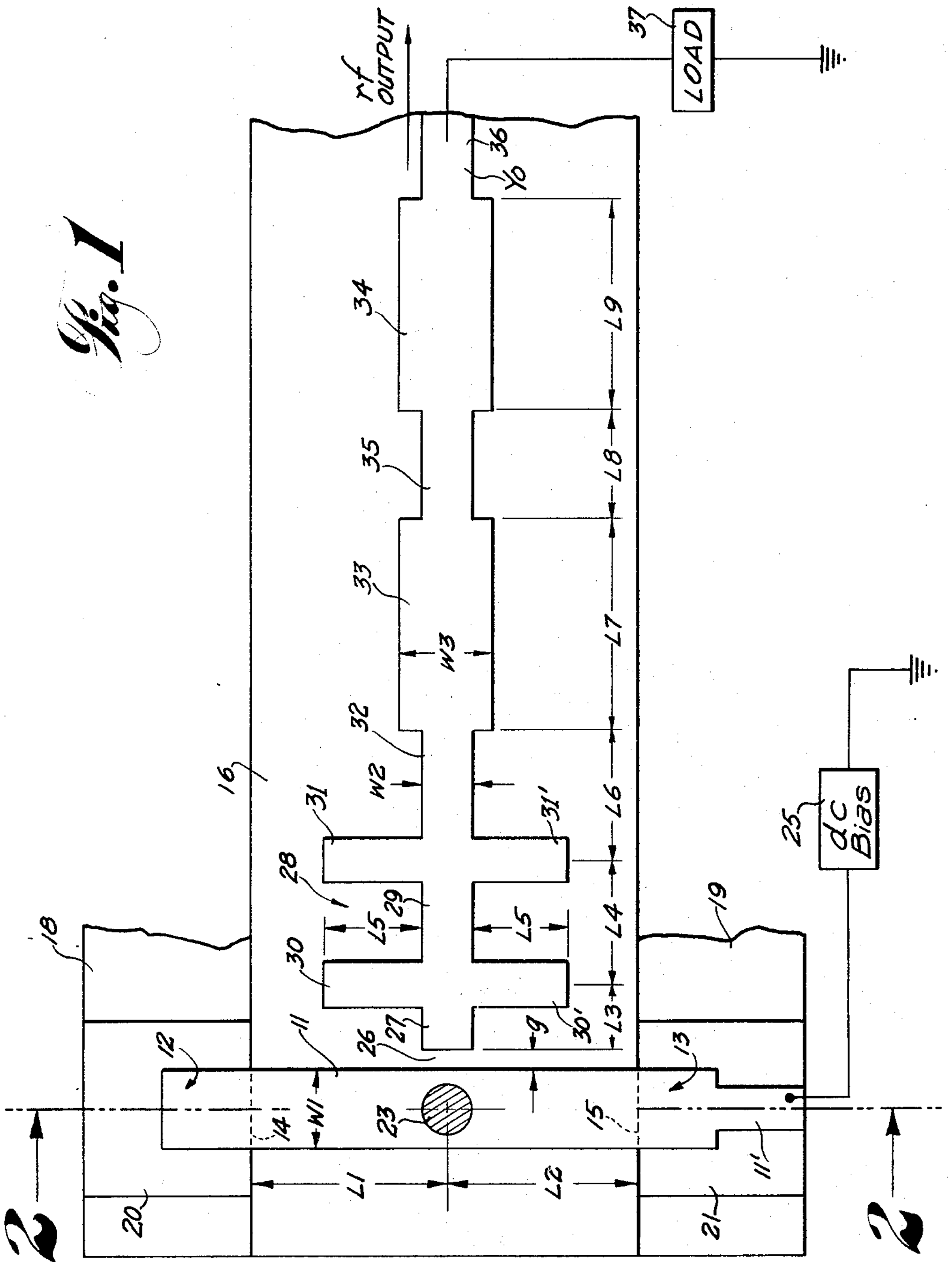
FIG. 1 is a plan view of a microstrip microwave oscillator constructed in accordance with a first embodiment of the invention in which a shorted-line resonator cavity is used for fundamental tuning, and a capacitively coupled orthogonal line terminated by an open-ended-line network functioning as a second harmonic reflector is used for second harmonic tuning.
Figure 2:
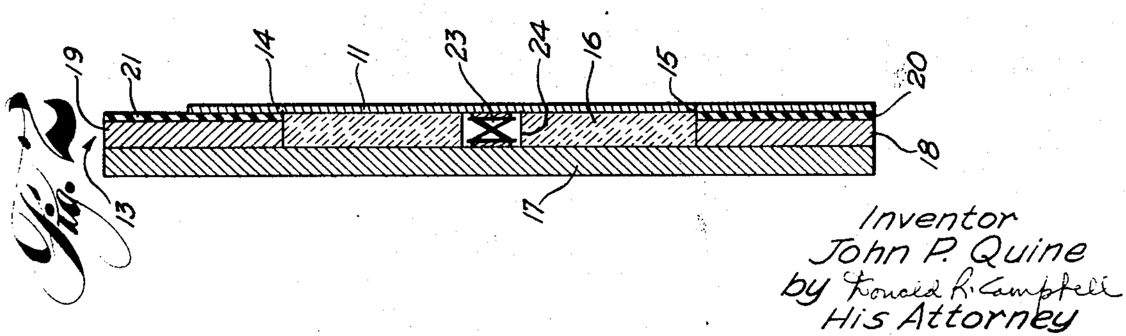
FIG. 2 is a cross-sectional view taken on line 2—2 of FIG. 1.

In FIG. 1, the single-tuned microstrip cavity includes a microstrip resonator 11 terminated at its ends by rf bypass capacitors 12 and 13. The strip resonator, known as a shorted-line resonator, has equivalent rf short circuit locations at the dashed lines 14 and 15. Referring also to FIG. 2, strip resonator 11 has a constant width W1 and is made of a thin layer of a good electrical conductor such as gold or some other appropriate metal. Although the invention is not limited to any particular fabrication process, resonator 11 and the other microstrip lines and microstrip components to be described are preferably formed on an alumina substrate 16, or a substrate of some other appropriate low dielectric loss material, by conventional printed circuit techniques, either a subtractive-type process such as photoetching or an additive-type process. Preferably alumina substrate 16 is given a flash coating of chromium on which is deposited a thin layer of gold, and is subsequently photoetched to the desired pattern. The other side of alumina substrate 16 is also coated with a thin layer of gold to facilitate soldering of base plate 17, which serves as the ground plane. By way of illustration, rf bypass capacitors 12 and 13 are formed by mounting metallic plates 18 and 19 on base plate 17 at either side of substrate 16, depositing thin insulating layers 20 and 21 of silicon dioxide, for example, on plates 18 and 19, and extending resonator strip 11 at either end to form the upper plates of the capacitors. Base plate 17 and capacitor plates 18 and 19 are preferably made of copper.

A transferred-electron diode 23 is connected directly between strip resonator 11 and the ground plane 17 at distances L1 and L2 from the respective rf bypass capacitors 12 and 13. For this purpose, alumina substrate 16 has a through-hole 24 for mounting diode 23, and a suitable contact arrangement is used to connect one terminal of the diode to strip resonator 11 and the other terminal to base plate 17. To apply a dc bias voltage to transferred-electron diode 23, one end of strip resonator 11 beyond bypass capacitor 13 has a narrowed extension 11' connected to a pulsed or continuous wave dc bias source 25 that is referenced to ground. The width W1 of strip resonator 11 is optimized to minimize the losses in the resonator and maximize power conversion efficiency from dc to rf. As will be explained later, the total length of resonator 11 and the distances L1 and L2 are chosen such that the resonator strip inductance resonates with the circuit capacitance at the fundamental frequency $f_1$ of the rf applied voltage.

Figure 3:
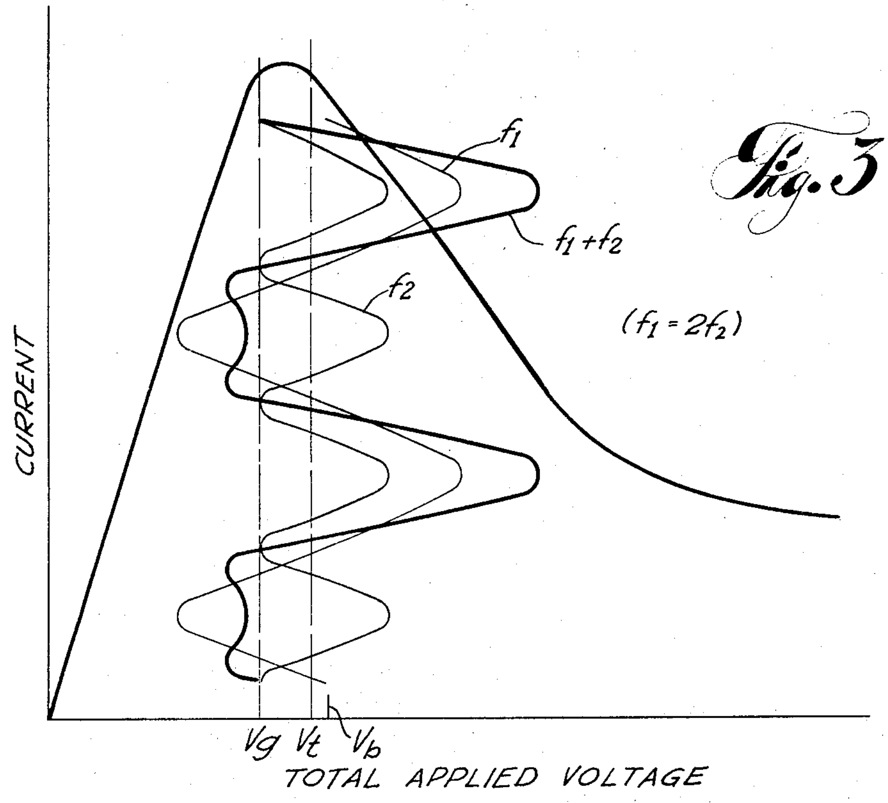
FIG. 3 shows a current-voltage characteristic for a transferred-electron diode, and superimposed rf voltage-time curves illustrating the addition of the bias, fundamental, and second harmonic voltages to obtain the resultant total applied voltage.

The microstrip cavity is particularly suitable for the operation of transferred-electron diode 23 in the LSA mode because the LSA mode can be reliably started with these cavities. The diode furthermore generates high microwave power when operated in this mode, and dc to rf conversion efficiency is enhanced by applying to the diode an rf voltage containing both the fundamental and second harmonic frequencies. By way of background, it has been found that for optimum conversion efficiency to the fundamental, the voltage waveform should contain only the fundamental and even harmonics. A voltage waveform which satisfies these conditions is a half sinusoid, but this ideal voltage waveform is difficult to synthesize. A reasonable approximation to the ideal waveform is one that contains only the fundamental and the second harmonic components. The resulting voltage waveform is illustrated in FIG. 3 superimposed upon a typical current-voltage negative resistance characteristic for a transferred-electron diode. This characteristic is derived from the well-known charge carrier velocity-electric field characteristic. The fundamental frequency voltage, labeled $f_1$, and the second harmonic frequency voltage, labeled $f_2$, where $f_1 = 2f_2$ and both are sine waves, are added to give the applied rf voltage $f_1 + f_2$. The total voltage applied to the diode is the sum of the bias voltage $V_b$ and the resultant rf voltage identified as $f_1 + f_2$. The bias voltage $V_b$, of course, is equal to or greater than the threshold voltage $V_t$, and the trough of the total applied voltage waveform drops below the quenching voltage $V_q$ in each rf cycle. The rf output voltage produced by the microstrip oscillator is ideally a sine wave rf voltage at the fundamental frequency $f_1$, although in a practical circuit spectral purity is not obtained and the output voltage contains a small amount of harmonic voltage at the second harmonic frequency $f_2$. In the LSA mode of operation, the frequency of the resultant applied rf voltage is high enough to keep the high-field dipole domain from forming within the diode, and this occurs when the period of oscillation frequency is shorter than several times the negative dielectric relaxation time. Further information on the normal LSA operating mode is given, for instance, in the book "Microwave Semiconductor Devices and Their Circuit Applications," edited by H.A. Watson, McGraw-Hill Book Company, New York, copyright 1969, Library of Congress Catalog Card No. 68-17197.

The microstrip cavity is coupled to an output line through a series coupling capacitor 26 (FIG. 1) formed by a gap of width *g*. This gap is defined by one side of resonator strip 11 and the parallel end of an orthogonally extending microstrip coupling line 27 with a length L3. Coupling line 27 is aligned with diode 23 and is terminated by an open-ended-line network 28 that functions as a low pass filter to transmit the fundamental frequency energy to the output line while substantially reflecting back the second harmonic frequency energy. Two-section open-ended-line network 28 comprises a base microstrip line 29 of length L4 aligned with coupling line 27, at the ends of which are two orthogonal, parallel open-ended, studs 30 and 31 each with a length L5. On the other side of line 29, in a symmetrical arrangement, are open-ended studs 30' and 31'. The remaining components of the microstrip oscillator are a microstrip coupling line 32 with length L6, a pair of fundamental frequency transformers 33 and 34 with respective lengths L7 and L9 connected by a coupling microstrip line 35 of length L8, and an rf output microstrip line 36 having a characteristic admittance Y*o*. The rf output voltage essentially at the fundamental frequency $f_1$ is applied to an appropriate load 37. All of the microstrip components between series coupling capacitor 26 and the rf output port are symmetrical about a center line extending perpendicular to strip resonator 11 and intersecting the location at which diode 23 is mounted. The several lines and open-ended studs have the same width W2 with the exception that transformers 33 and 34 have a width W3. As previously explained with regard to strip resonator 11, these components are preferably formed by printed circuit techniques on the surface of the alumina substrate 16 and are thus planar with one another and resonator 11. By making both the thickness of alumina substrate 16 and the line width W2 equal to 50 mils, the characteristic impedance of the various microstrip lines and open-ended stubs is 50 ohms.

In open-ended-line low pass filter network 28, the degree of transmission at the fundamental frequency $f_1$ and the second harmonic frequency $f_2$ is determined by line lengths L4 and L5. The network is made nearly "reflection-less" at the fundamental frequency by making the sum of line lengths L4 + L5 equal to approximately $\lambda_1/4$, where $\lambda_1$ is the microstrip wavelength measured at the fundamental frequency $f_1$, and by making the characteristic admittance of these lines equal to the characteristic admittance Y*o* of the output line. The second harmonic energy can be reflected back into the cavity with varying degree, depending on the ratio L4/L5, and this establishes a reflective plane near the end of line length L3 at the second harmonic frequency that results in a minimum impedance condition at this location. In most cases, L4 = L5 = $\lambda_1/8$ to obtain maximum reflection of the second harmonic energy back into the cavity, and a short circuit condition is established at a plane near this end of line length L3 at the second harmonic frequency. This is the circuit illustrated. The open-ended-line network 28 construction with L4 not equal to L5 can provide resistive loading at $f_2$ if this is required to optimize performance.

The microstrip line 27 of length L3 terminated by open-ended-line network 28 provides the inductance to tune the circuit capacitance to parallel resonance at the second harmonic frequency $f_2$. The circuit capacitance is the combined capacitance of transferred-electron diode 23, its mount, and of series coupling capacitor 26. The width of gap *g* is determined empirically to obtain impedance matching between diode 23 and load 37 at the fundamental frequency $f_1$. Tuning of the microstrip cavity to parallel resonance at the fundamental frequency is obtained by resonating the inductance provided by strip resonator 11 with the circuit capacitance provided by the combined capacitance of diode 23, its mount, and series coupling capacitor 26. Further impedance matching at the fundamental frequency $f_1$ is obtained by the use of transformers 33 and 34. The line lengths L7 and L9 of these transformers are made equal to $\lambda_1/4$ at the fundamental frequency $f_1$, but this is equal to $\lambda_2/2$ at the second harmonic frequency $f_2$. Impedance matching at the fundamental frequency is therefore obtained by adjusting the characteristic impedance of transformers 33 and 34, and at the second harmonic frequency the transformers are nearly "reflectionless." Transformers 33 and 34 operate to trim the impedance at the fundamental frequency and are not essential to the practice of the invention. Also, the particular form of open-ended-line network 28 that is illustrated can be replaced by other appropriate types of microstrip low pass filters.

Briefly reviewing the operation of the FIG. 1 embodiment of the invention, this microstrip microwave oscillator includes a microstrip cavity that is singletuned at the fundamental and second harmonic frequencies to achieve enhanced dc to rf conversion efficiencies. The microstrip cavity, including shorted-line strip resonator 11 with rf bypass capacitors 12 and 13 at each end and diode 23 connected between the resonator strip and ground, is energized by a dc biasing voltage, preferably pulsed, supplied from bias source 25 connected through strip resonator extension 11' to rf bypass capacitor 13. The line length L1 + L2 is chosen to be shorter than $\lambda_1/2$ at the fundamental frequency $f_1$, and the inductance provided by these lines is resonated with the circuit capacitance comprising the combined capacitance of diode 23 and series coupling capacitor 26, to obtain parallel resonance at the fundamental frequency $f_1$. To match the impedance of diode 23 to that of load 37 at the fundamental frequency, series coupling capacitor 26 is adjusted empirically and the impedance can be further trimmed by transformers 33 and 34, which have line lengths $\lambda_1/4$ at the fundamental frequency. Open-ended-line network 28 is constructed with the sum of line lengths L4 + L5 equal to $\lambda_1/4$ at the fundamental frequency, so as to be nearly "refelctionless" at the fundamental frequency $f_1$ while highly reflecting the harmonic energy at the second harmonic frequency $f_2$ back into the cavity. Tuning to parallel resonance at the second harmonic frequency is achieved by resonating the circuit capacitance with the inductance provided by line 27 with length L3. Coupling line 27 also provides resistive loading at the second harmonic frequency to provide a means for second harmonic impedance matching. Due to transmission losses some of the second harmonic energy appears at the rf output line 36. The resultant rf voltage applied to diode 23 with fundamental and second harmonic components is indicated in FIG. 3 as the waveform $f_1 + f_2$, and the oscillatory voltage appearing at the rf output port is essentially an oscillatory voltage at the fundamental frequency $f_1$. Based on calculations of the admittance presented to diode 23 by the cavity as a function of frequency, it is shown that the cavity can be adjusted to provide a broad phase-locking bandwidth in the order of about 12–15 percent at the fundamental frequency. The bandwidth over which the second harmonic frequency can also be tuned in order to obtain enhanced conversion efficiency is relatively narrow with typical values of the circuit parameters, on the order of about three percent. This is adequate for many applications, however. The tuned bandwidth that is referred to is conventionally bounded by those points at which the resistive and reactive impedance components have equal absolute values.

With diode 23 mounted in the center of strip resonator 11 such that L1 = L2, the oscillation is in the low-Q high power LSA relaxation mode. This operating mode is described in the article "A High Power LSA Relaxation Oscillator" by B. Jeppsson and P. Jeppesen, Proceedings of the IEEE, June 1969, pp. 1218, 1219, and is characterized by the fact that the device voltage wave shape is roughly half sinusoidal and the frequency increases as the dc bias voltage increases. The frequency dependence on bias voltage offering wide electronic tuning and the voltage wave shape exhibit the typical characteristics of relaxation oscillations known from tunnel diodes. The fast rise and decay of the rf voltage above threshold makes possible LSA operation of inhomogeneous bulk diodes with high $n_oL$ products. For the microstrip cavity configuration in which L1 = L2, the line length L1 and rf bypass capacitor 12 can be eliminated, and in this case the inductance of the line of length L2 tunes the circuit capacitance at the fundamental frequency $f_1$. This is a more compact, in-line cavity, but the configuration of FIG. 1 has a somewhat higher unloaded Q. With the diode 23 mounted off center along resonator strip 22 in FIG. 1, the loaded Q of the cavity can be high, and the oscillation is in the normal high-Q LSA mode.

By way of example in a microwave oscillator constructed in accordance with the invention for rf output frequencies between 4.0 and 5.0 GHz, the width W1 of the resonator strip 11 was 0.160 inch, and the lengths L1 and L2 were equal and ranged between 0.200 inch and 0.250 inch. Each of the rf bypass capacitors 12 and 13 provided approximately 20 picofarads. The gap width $g$ of series coupling capacitor 26 was adjusted manually. A 50 ohm characteristic impedance output line 36 was used, and the microstrip width W2 was therefore 50 mils for an alumina substrate 16 with the same thickness. A narrow pulse, low duty factor dc biasing voltage was used, typically 100 NS pulses and 60 PPS. In a balanced cavity, operation was in the LSA relaxation mode with the exception of one higher resistivity diode which operated in the dipole domain mode.

Figure 4:
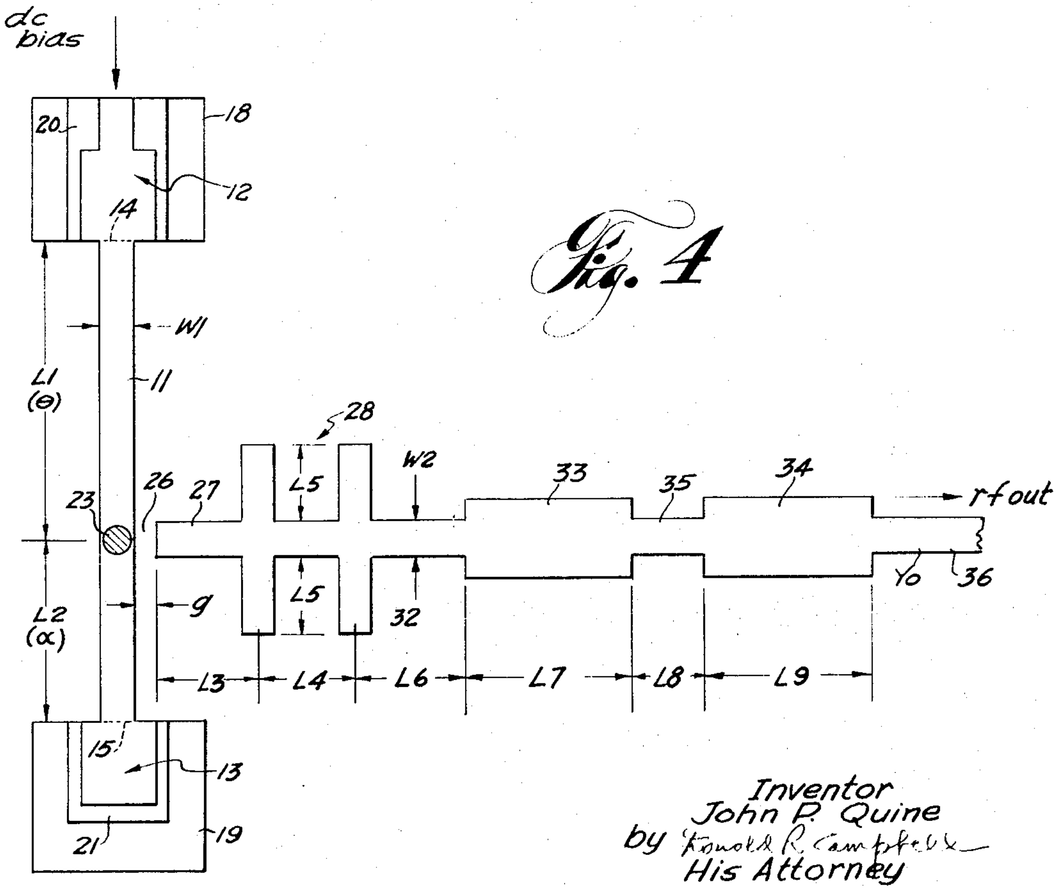
FIG. 4 is a plan view, in schematic form, of a second embodiment of the invention that is similar to FIG. 1 but uses a two-frequency microstrip cavity comprising a shorted-line resonator tuned at both the fundamental and second harmonic.

The second embodiment of the invention illustrated in FIG. 4 employs a microstrip resonant cavity that can be tuned simultaneously at both the fundamental and second harmonic frequencies by properly adjusting line lengths L1 and L2 of strip resonator 11. In this configuration, coupling line 27, representing the distance from series coupling capacitor 26 to open-ended-line filter 28, has a length L3 equaL to $\lambda_2/4$ measured at the second harmonic frequency $f_2$ in order that the fundamental frequency output line appears as an open circuit at $f_2$. In FIG. 4 the microwave oscillator components are illustrated schematically and are preferably formed as printed circuits on an alumina substrate as described previously with regard to FIGS. 1 and 2. The components have the same dimensions except as noted specifically. Transferred-electron diode 23 is connected between strip resonator 11 and the microstrip ground plane at distances corresponding to $\theta$ and $\alpha$ electrical degrees from the respective effective rf short circuit locations 14 and 15, where the distance $\theta$ is equal to line length L1 and $\alpha$ is equal to line length L2, both measured at the fundamental frequency $f_1$.

Figure 5:
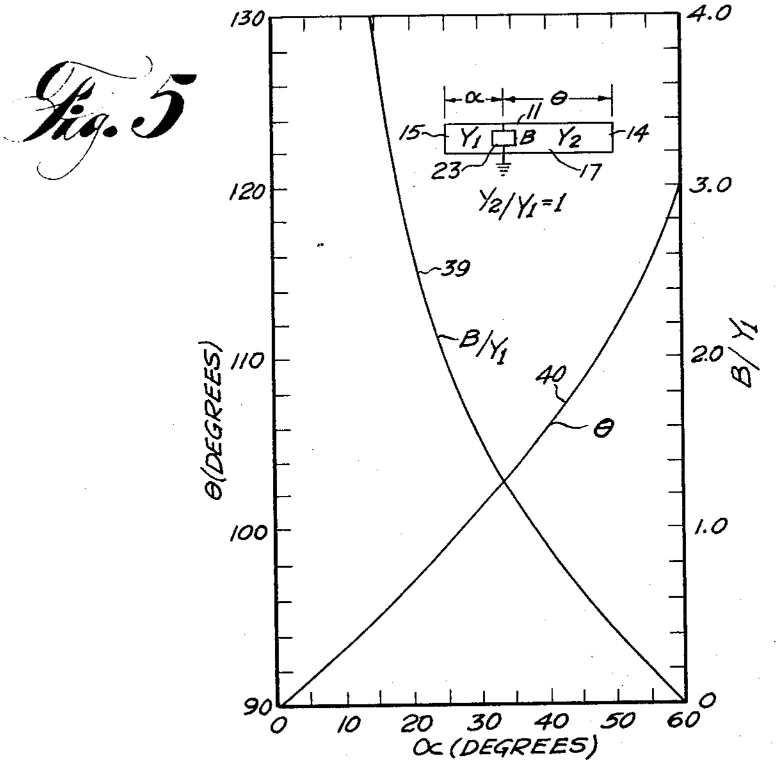
FIG. 5 shows graphical design data for the shorted-line resonator of FIG. 4, specifically plots of line lengths $\alpha$ and $\theta$ (measured at the fundamental frequency) vs. the susceptance B (normalized to the admittance of the line length $\alpha$) due to the total shunt circuit capacitance at the fundamental frequency.

The microstrip cavity provided by shorted-line strip resonator 11 and diode 23 connected in shunt to the microstrip ground plate is a two-frequency tuned cavity. By properly adjusting $\theta$ and $\alpha$ parallel resonance is obtained at both the fundamental frequency $f_1$ and the second harmonic frequency $f_2$ for a given value of a total shunt capacitance, C, contributed by diode 23, including that of its mount, and series coupling capacitor 26. An equivalent circuit diagram is given in FIG. 5 in connection with design data for such a two-frequency tuned microstrip cavity. The line of length $\alpha$ has an admittance Y1, the line of length $\theta$ has an admittance Y2, and diode 23 connected between their junction and the microstrip ground plane 17 has a capacitive susceptance B equal to $2\pi f_1 C$. FIG. 5 shows calculated data of $\theta$ and B versus $\alpha$, where the susceptance B is normalized to admittance Y1, i.e., is given as B/Y1, and Y2/Y1 = 1. Characteristic 39 shows the value of B/Y1 for a given value of $\alpha$ in degrees, while characteristic 40 shows the value of $\theta$ for a given value of $\alpha$.

The derivation of the equations used to calculate data to plot characteristic curves 39 and 40 is as follows. At the fundamental frequency $f_1$, $$Y1 \cot \alpha + Y2 \cot \theta = B.$$

At the second harmonic frequency $f_2 = 2f_1$, it is assumed that $\alpha$, $\theta$, and B each have twice the value at $f_1$. Thus $$Y1 \cot 2\alpha + Y2 \cot 2\theta = 2B.$$

Let $$F1 = \cot\alpha + Y2/Y1 \cot\theta = B/Y1$$

$$F2 = \frac{1}{2}(\cot 2\alpha + Y2/Y1 \cot 2\theta) = B/Y1$$

$$F3 = F2 - F1 = 0$$

Functions F1, F2, and F3 are calculated and values $\alpha$ and $\theta$ are determined for which F3 is zero. The results are given in FIG. 5.

Open-ended-line filter 28 again acts as a reflector for the second harmonic frequency, and is adjusted to provide low reflection at the fundamental frequency. This is accomplished by making both line lengths L4 and L5 equal to $\lambda_2/4$ at the second harmonic frequency. The characteristic impedance of the open-ended-lines furthermore is equal to the characteristic impedance of output line 36. The length L3 of coupling line 27 is also made equal to $\lambda_2/4$ at the second harmonic frequency $f_2$ in order that the fundamental frequency $f_1$ output line appears as an open circuit at $f_2$. That is, with L3 = 90° at $f_2$, a high impedance is presented to the diode due to this line. The operation of the microwave oscillator embodiment of FIG. 4 embodying a two-frequency tuned microstrip cavity is similar to FIG. 1, and further explanation is not believed to be needed. This cavity is also especially suited for the operation of transferred-electron diodes in the LSA mode, because the LSA mode can be reliably started with these cavities. As with the embodiment of FIG. 1, the bandwidth at the fundamental frequency is relatively wide, while the bandwidth at the second harmonic frequency is relatively narrow. However, the length L3 is greater with the FIG. 4 configuration.

Figure 6:
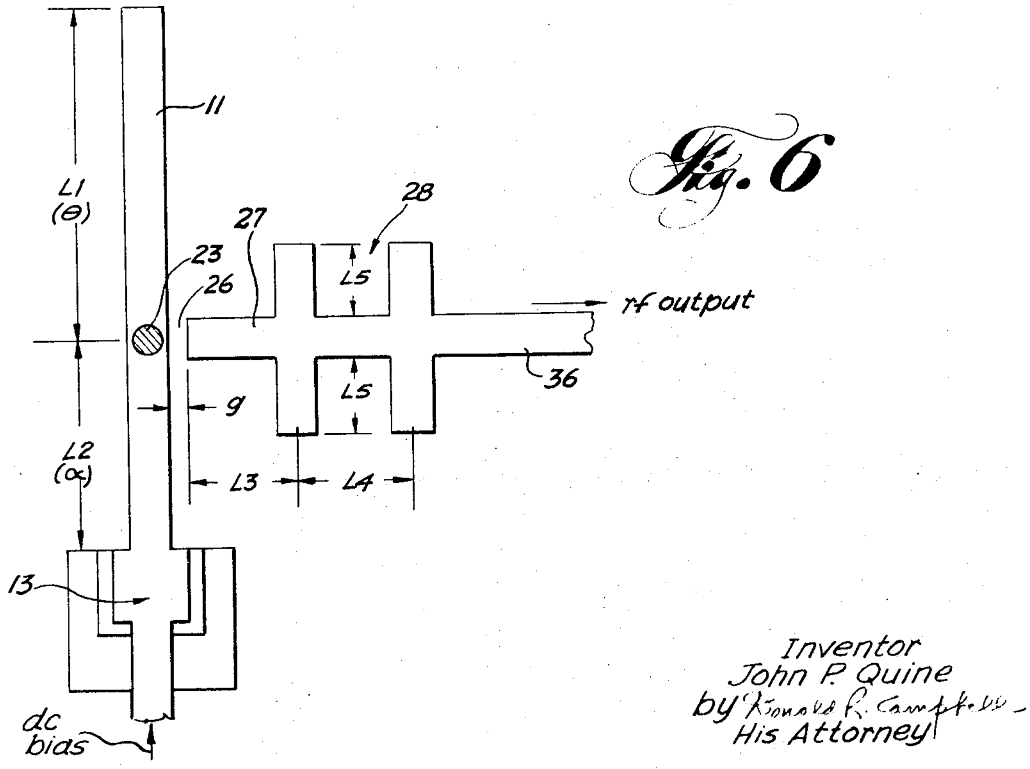
FIG. 6 is a schematic plan view of a modification of the microstrip oscillator of FIG. 4 employing a shorted-line, open-line resonator cavity tuned at both the fundamental and second harmonic frequencies.
Figure 7:
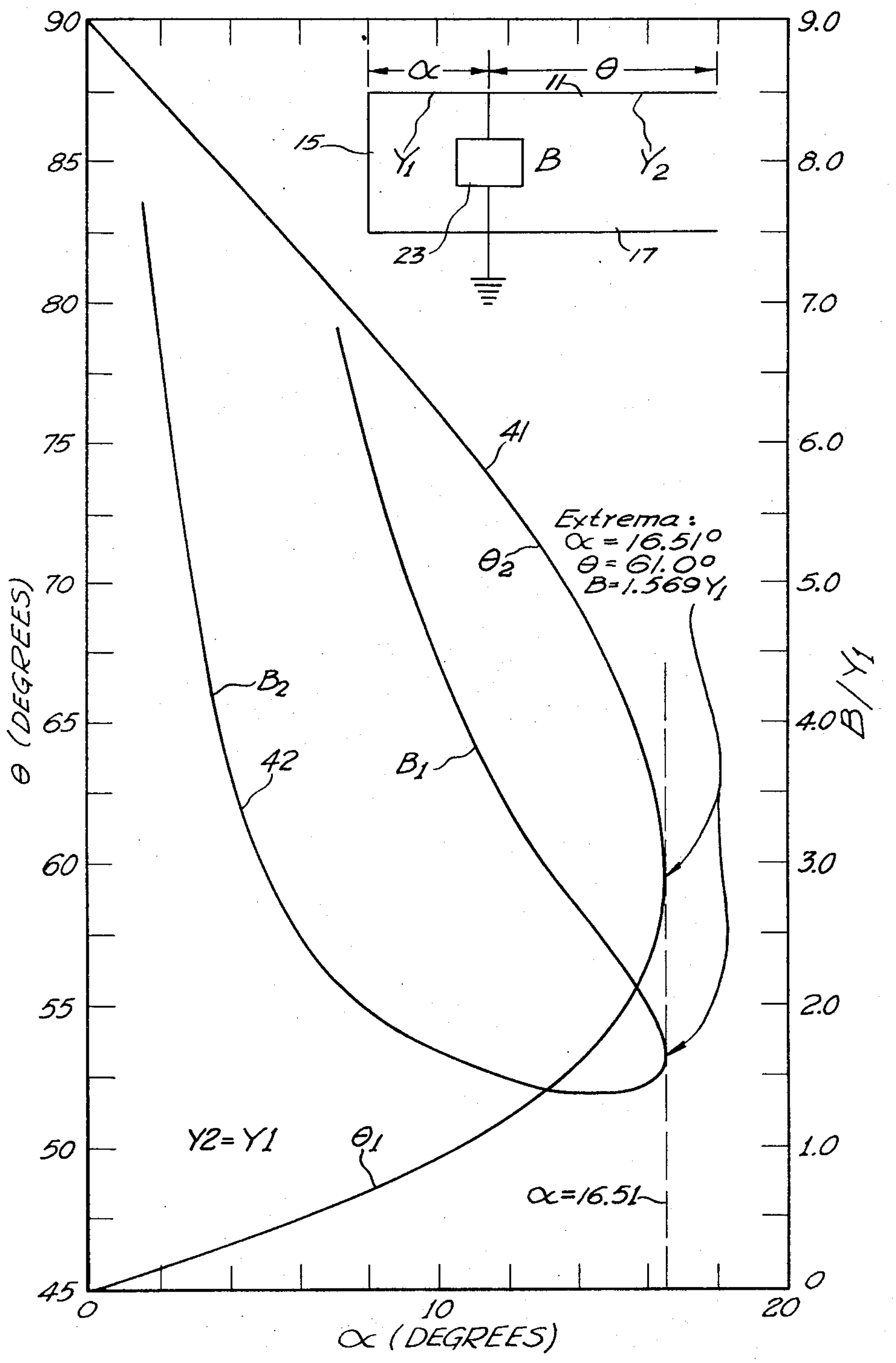
FIG. 7 shows graphical design data for the modified resonator of FIG. 6, similar to that given in FIG. 5 with the exception that $\theta$ and B are doubled-valued functions of $\alpha$ and all have extreme values.

FIG. 6 is a modification of FIG. 4, and illustrates a microstrip cavity with a shorted line, open-ended strip resonator 11. This is a second microstrip cavity configuration by means of which both the fundamental and second harmonic frequencies are tuned. One end of strip resonator 11 is connected to a rf short circuit, provided by rf bypass capacitor 13, and the other end is open-circuited. The same considerations apply for the coupling capacitor 26 and open-ended line network 28, but matching transformers 33 and 34, not always needed, are omitted from this embodiment. The equivalent circuit diagram for this microstrip cavity is shown at the top of FIG. 7. In FIG. 7, the values of $\theta$ and of the capacitance susceptance B, normalized to admittance Y1, are plotted as a function of $\alpha$ to obtain values that produce parallel resonance at both $f_1$ and $f_2$. The values of $\alpha$, $\theta$, and B apply at $f_1$. The derviation of the equations used to calculate data for plotting characteristic curves 41 and 42 is similar to that described previously in connection with FIG. 5. It is seen that $\theta$ and B are doubled valued functions of $\alpha$, and that $\alpha$ cannot exceed 16.51°. Two sets of solutions $\theta_1$, $B_1$ and $\theta_2$, $B_2$ are obtained, and these sets merge at the extreme value of $\alpha = 16.51°$ at $f_1$. As an example, for a value of B = 3.0, there are two possible values of $\alpha$, namely, a first value of almost five degrees and a second value of about 13°. For these values of $\alpha$, $\theta$ is respectively about 83° and about 52°. The operation of the microwave oscillator of FIG. 6 is essentially the same as that of the FIG. 5 configuration, and is also useful with transferred-electron diodes operated in the LSA mode.

All three microstrip microwave oscillators herein described can employ, in general, solid state microwave oscillator devices other than the transferred-electron diode, such as the avalanche diode, and have utility where other than fundamental frequency tuning is required. The microwave oscillators may also employ transferred-electron diodes operated in other modes than the LSA mode, e.g., the dipole-domain mode. The frequency range of 3.0 to 10.0 GHz is of greatest interest, although they are not limited to this range.

In summary, several configurations of a microwave oscillator in microstrip form are tuned simultaneously at the fundamental and second harmonic frequencies to obtain enhanced dc to rf conversion efficiency to a fundamental frequency output voltage in oscillators employing solid state devices. These oscillators have the advantages of small size, low weight, and economy deriving from the use of microstrip components and solid state devices, and are advantageously fabricated by printed circuit techniques.

While the invention has been particularly shown and described with regard to several preferred embodiments thereof, it will be understood by those skilled in the art that the foregoing and other changes in form and details may be made therein without departing from the spirit and scope of the invention.

What I claim as new and desire to secure by Letters Patent of the United States is:

1. A microstrip microwave oscillator circuit tuned simultaneously at fundamental and second harmonic frequencies comprising
   - a strip resonator separated from a ground plane by an insulator, a solid-state microwave oscillator device connected between said strip resonator and ground plane, and means for applying a bias voltage to said oscillator device,
   - an orthogonally extending output microstrip circuit separated from a ground plane by an insulator and including a coupling microstrip line that is series capacitance coupled to said strip resonator in alignment with said oscillator device and terminated by a microstrip low pass filter network which passes fundamental frequency energy while reflecting second harmonic energy,
   - said oscillator circuit being tuned simultaneously to parallel resonance at the fundamental and second harmonic frequencies to apply to said oscillator device a radio frequency voltage that is the sum of the fundamental and second harmonic voltages and produces an output fundamental frequency voltage with enhanced efficiency.

2. A circuit according to claim 1 wherein said strip resonator is tuned to parallel resonance with the circuit capacitance at the fundamental frequency, and
   - said low pass filter network provides a minimum impedance plane at the second harmonic frequency near the end of said coupling line, and the inductance of said coupling line is tuned with the circuit capacitance to obtain second harmonic tuning.

3. A circuit according to claim 1 wherein said low pass filter network provides an effective open circuit at the second harmonic frequency near the end of said coupling line, and said coupling line is approximately a quarter wavelength line at the second harmonic frequency, and
   - said oscillator device is mounted intermediate the ends of said strip resonator at distances to obtain tuning with the circuit capacitance at both the fundamental and second harmonic frequencies.

4. A circuit according to claim 1 wherein said low pass filter network is an open-ended-line network, and
   - said series coupling capacitance is dimensioned to obtain fundamental frequency impedance matching between said oscillator device and a load.

5. A microstrip microwave oscillator circuit tuned simultaneously at fundamental and second harmonic frequencies comprising
   - a plurality of orthogonally arranged conductive microstrip components separated from a conductive ground plane by an insulating layer including
   - a strip resonator, a solid-state microwave oscillator device connected between said strip resonator and ground plane, and means for applying a bias voltage to said oscillator device,
   - a capacitively coupled output microstrip circuit extending orthogonal to said strip resonator in alignment with said oscillator device and comprising a coupling line terminated by an open-ended-line filter network which is in turn connected to an output line supplying fundamental frequency output voltage, wherein
   - said open-ended-line network passes fundamental frequency energy while reflecting second harmonic frequency energy, and provides an effective short circuit at the second harmonic frequency near the end of said coupling line, the inductance of said coupling line is tuned with the circuit capacitance to obtain second harmonic frequency tuning, and the inductance of said strip resonator is tuned with the circuit capacitance to obtain fundamental frequency tuning.

6. A circuit according to claim 5 wherein said capacitively coupled output circuit includes a series coupling capacitance formed between said strip resonator and coupling line to provide fundamental frequency impedance matching between said oscillator device and a load, and further including a pair of strip transformers between said open-ended-line filter network and output line for additional impedance matching at the fundamental frequency.

7. a circuit according to claim 5 wherein said strip resonator has a radio frequency bypass capacitor connected to each end thereof, and said solid state oscillator device is mounted at the midpoint of said strip resonator, and said open-ended-line filter network is made of longitudinal and orthogonal components with the same characteristic admittance as said coupling line and output line and a sum of lengths equal to one quarter wavelength measured at the fundamental frequency.

8. A circuit according to claim 5 wherein all of said microstrip components are printed circuit components formed on one surface of said insulating layer, and said ground plane is adjacent the other surface of said insulating layer.

9. A microstrip microwave oscillator circuit tuned simultaneously at fundamental and second harmonic frequencies comprising a plurality of orthogonally arranged conductive microstrip components separated from a ground plane by an insulating layer including a strip resonator, a solid state microwave oscillator device connected between said strip resonator and ground plane, and means for applying a bias voltage to said oscillator device, a capacitively coupled output microstrip circuit extending orthogonal to said strip resonator in alignment with said oscillator device and comprising a coupling line terminated by an open-ended-line filter network which is in turn connected to an output line supplying fundamental frequency output voltage, wherein said open-ended-line filter network passes fundamental frequency energy while reflecting second harmonic energy, and provides an open circuit at the second harmonic frequency near the end of said coupling line, and said solid state oscillator device is mounted intermediate the ends of said strip resonator at distances to obtain tuning with the circuit capacitance at both the fundamental and second harmonic frequencies.

10. A circuit according to claim 9 wherein said capacitively coupled output circuit includes a series coupling capacitance formed between said strip resonator and coupling line to provide fundamental frequency impedance matching between said oscillator device and a load, and said coupling line has a length equal to a quarter wavelength at the second harmonic frequency.

11. A circuit according to claim 10 wherein said strip resonator is a shorted-line resonator with radio frequency bypass capacitors at each end.

12. A circuit according to claim 10 wherein said strip resonator is a shorted-line, open-ended resonator with a radio frequency bypass capacitor at one end thereof.

13. A circuit according to claim 10 wherein all of said microstrip components are printed circuit components formed on one surface of said insulating layer, and said ground plane is adjacent the other surface of said insulating layer.

14. A circuit according to claim 10 wherein said strip resonator has a radio frequency bypass capacitor at one end thereof with one plate formed by extending said strip resonator, said means for applying a bias voltage being a unidirectional voltage source connected to said bypass capacitor plate, and wherein said solid state oscillator device is a transferred-electron diode.

* * * * *